(12) United States Patent
Van Keymeulen

(10) Patent No.: US 9,839,123 B2
(45) Date of Patent: Dec. 5, 2017

(54) SMART TEXTILE PRODUCT AND METHOD FOR FABRICATING THE SAME

(71) Applicants: IMEC VZW, Leuven (BE); Universiteit Gent, Gent (BE)

(72) Inventor: Bjorn Van Keymeulen, Zottegem (BE)

(73) Assignees: IMEC VZW, Leuven (BE); Universiteit Gent, Ghent (BE)

( * ) Notice: Subject to any disclaimer, the term of this patent is extended or adjusted under 35 U.S.C. 154(b) by 0 days.

(21) Appl. No.: 15/503,378

(22) PCT Filed: Sep. 17, 2015

(86) PCT No.: PCT/EP2015/071295
§ 371 (c)(1),
(2) Date: Feb. 10, 2017

(87) PCT Pub. No.: WO2016/050525
PCT Pub. Date: Apr. 7, 2016

(65) Prior Publication Data
US 2017/0231089 A1 Aug. 10, 2017

(30) Foreign Application Priority Data
Sep. 29, 2014 (EP) .................................... 14186909

(51) Int. Cl.
*H05K 1/09* (2006.01)
*H05K 1/00* (2006.01)
(Continued)

(52) U.S. Cl.
CPC ........... *H05K 1/038* (2013.01); *H05K 1/0283* (2013.01); *H05K 1/111* (2013.01); *H05K 1/181* (2013.01);
(Continued)

(58) Field of Classification Search
CPC ...... H05K 1/038; H05K 1/0283; H05K 1/111; H05K 1/181; H05K 3/32; H05K 3/284;
(Continued)

(56) References Cited

U.S. PATENT DOCUMENTS 9,674,950 B1 * 6/2017 Liu .................... H05K 1/038
2004/0259391 A1 * 12/2004 Jung .................... D03D 1/0082
439/37

(Continued)

FOREIGN PATENT DOCUMENTS

GB 2396252 A 6/2004

*Primary Examiner* — Sherman Ng
(74) *Attorney, Agent, or Firm* — Knobbe Martens Olson & Bear, LLP

(57) ABSTRACT

The present disclosure relates to a smart textile product and a method for manufacturing a smart textile product. The smart textile product is provided with a flexible and/or stretchable textile fabric (10) comprising a plurality of electrically conductive threads (11, 12) and at least one rigid electronic or optoelectronic component (20) comprising at least one electrically conductive pad (21, 22), which is in electrical contact with at least one of the plurality of electrically conductive threads. The smart textile product (10) comprises an elastomeric encapsulation layer (31) in which the electrical connection (1, 2) is embedded, so as to provide a gradual transition in deformability between the flexible and/or stretchable textile fabric (10) and the at least one rigid component (20) at the location of the at least one electrical connection (1, 2).

19 Claims, 3 Drawing Sheets

(51) Int. Cl.
*H05K 1/03* (2006.01)
*H05K 1/02* (2006.01)
*H05K 1/11* (2006.01)
*H05K 1/18* (2006.01)
*H05K 3/32* (2006.01)
*H05K 3/28* (2006.01)

(52) U.S. Cl.
CPC ............... *H05K 3/284* (2013.01); *H05K 3/32* (2013.01); *H05K 2201/0133* (2013.01); *H05K 2201/0281* (2013.01); *H05K 2201/10977* (2013.01); *H05K 2203/1316* (2013.01); *H05K 2203/1322* (2013.01)

(58) Field of Classification Search
CPC ... H05K 2201/0133; H05K 2201/0281; H05K 2201/10977; H05K 2201/1316; H05K 2203/1322
USPC .................................. 174/251, 254; 361/749
See application file for complete search history.

(56) References Cited

U.S. PATENT DOCUMENTS

2005/0029680 A1* 2/2005 Jung ...................... H05K 3/284
 257/787
2012/0157904 A1* 6/2012 Stein ........................ A61F 7/02
 602/43
2015/0114451 A1* 4/2015 Anderson ............. H01L 31/048
 136/251

\* cited by examiner

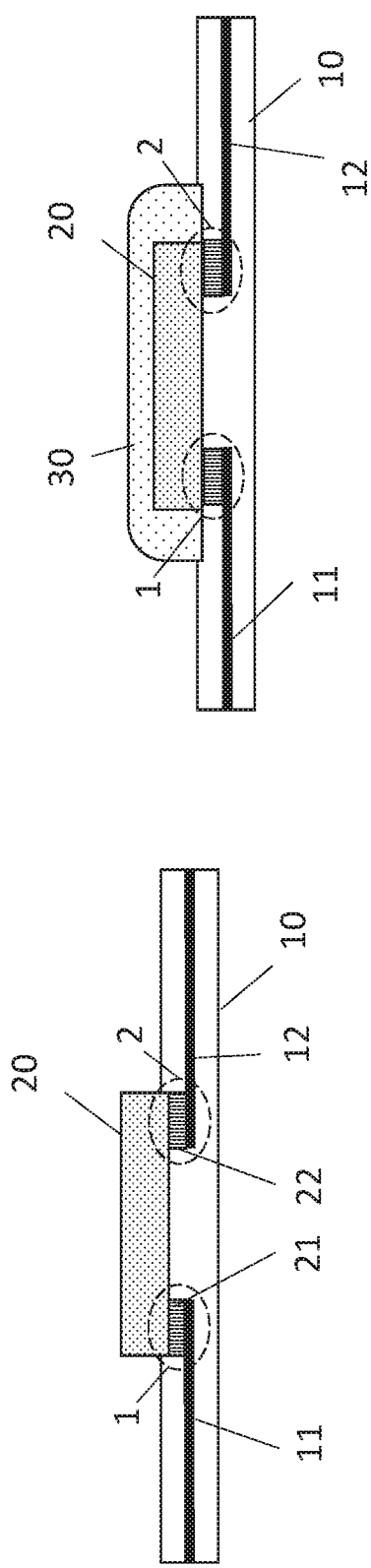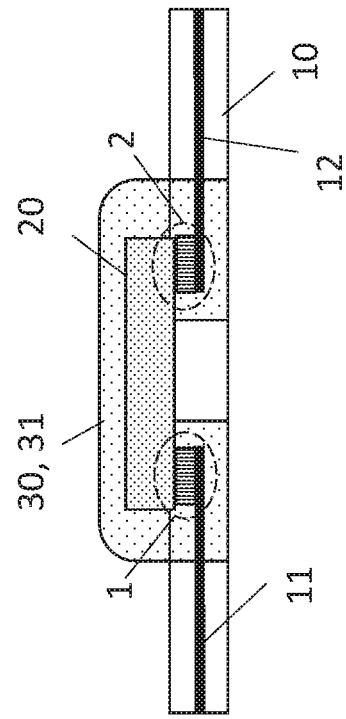

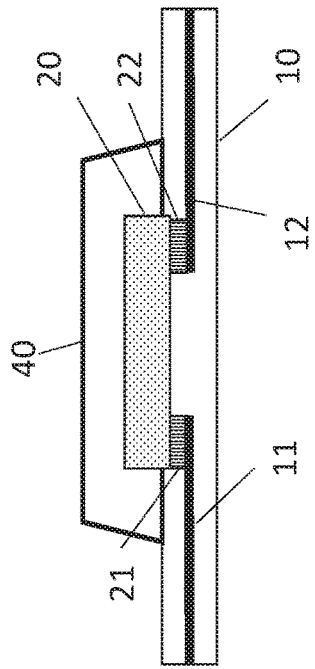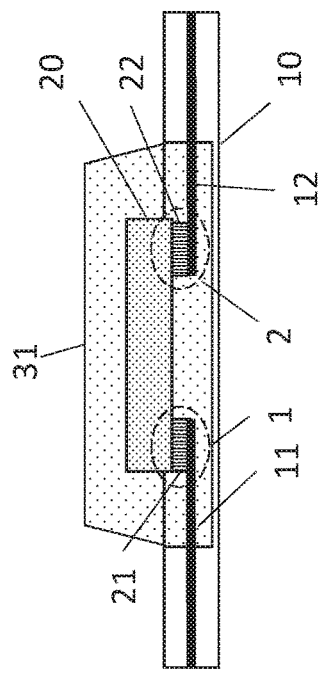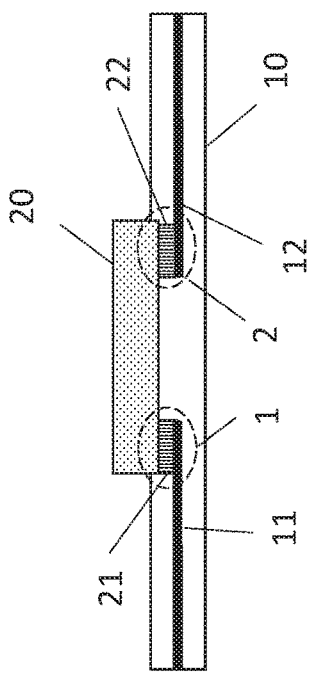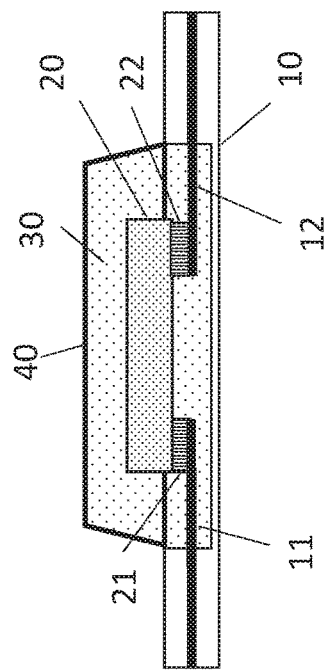
FIG 2

SMART TEXTILE PRODUCT AND METHOD FOR FABRICATING THE SAME

INCORPORATION BY REFERENCE TO RELATED APPLICATIONS

Any and all priority claims identified in the Application Data Sheet, or any correction thereto, are hereby incorporated by reference under 37 CFR 1.57. This application is the national phase under 35 U.S.C. §371 of prior PCT International Application No. PCT/EP2015/071295 which has an International Filing Date of Sep. 17, 2015, which designates the United States of America, and which claims priority to European Application No. EP 14186909.9 filed Sep. 29, 2014. Each of the aforementioned applications is incorporated by reference herein in its entirety, and each is hereby expressly made a part of this specification.

FIELD

The present disclosure is related to smart textile products and to methods for fabricating smart textile products, the smart textile products comprising electronic and/or optoelectronic components attached to a textile fabric and electrically connected to electrically conductive threads integrated with the textile fabric.

STATE OF THE ART

Methods are known for attaching and electrically connecting electronic and/or optoelectronic components to a textile fabric containing electrically conductive wires or threads. Such integration of components with textile may for example be obtained by means of conductive adhesives or by soldering, or by mechanical methods such as crimping.

The reliability of such 'smart' textile, e.g. 'electronic' textile or 'photonic' textile, under mechanical stress such as bending, elongation and torsion is still an issue. The smart textile products may for example be subjected to mechanical stress during normal use or when washing the products.

Mechanical failure and consequently electrical failure may occur due to mechanical stress at locations where the components are attached to the textile or at the location of the electrical connections between the components and the electrically conductive threads. Failure may for example be due to wire fractures at the transition from a rigid component to the flexible or stretchable textile.

To protect the electrical connections between the integrated components and the electrically conductive threads, a rigid epoxy encapsulation layer may be locally applied, e.g. covering the integrated component and its electrical connections, thus avoiding early breakage of these connections. However, also when applying such rigid epoxy protection, a reliability issue remains. Mechanical stress may result in breakage of the conductive thread and/or the non-conductive textile carrier at the transition between the textile and the rigid epoxy encapsulation layer.

In "Failure Modes in Textile Interconnect Lines", Hans de Vries et al, IEEE Electron Device Letters, Vol. 33, No. 19, October 2012, an alternative method is described to reduce failure in photonic textiles. According to this method, the attached devices are covered with a stiff encapsulation layer to protect the attachment points. An additional textile layer is placed between the edge of the stiff encapsulation layer and the flexible or stretchable textile region away from the device. In this way a more gradual transition between the stiff and the non-stiff (flexible or stretchable) parts is obtained and failure is reduced. It is a disadvantage of this approach that it requires multiple textile layers, making it a rather complex method.

SUMMARY

The present disclosure aims to provide a method for fabricating smart textile products, wherein the method results in a product with an improved reliability under mechanical stress as compared to products made by known methods, i.e. wherein the method results in a product with reduced mechanical and electrical failure rates under mechanical stress as compared to products made by known methods. The present disclosure further aims to provide such a fabrication method wherein the method is less complex as compared to known methods.

The present disclosure further aims to provide smart textile products with an improved reliability under mechanical stress, i.e. with reduced mechanical and electrical failure rates under mechanical stress, as compared to known smart textile products.

In the context of the present disclosure, a smart textile product is a device or a product comprising a textile fabric with integrated electrically conductive threads and comprising at least one electronic or optoelectronic component attached to the textile fabric, the at least one electronic or optoelectronic component being electrically connected to at least one electrically conductive thread of the textile fabric. The textile fabric in the context of the present disclosure may be a flexible and/or stretchable textile fabric.

More specifically according to a first aspect of the present disclosure a smart textile structure is provided. The smart textile structure is provided with a flexible and/or stretchable textile fabric (10) comprising a plurality of electrically conductive threads. At least one rigid electronic or optoelectronic component comprising at least one electrically conductive pad, herein also called contact pad, which electrically conductive pad is arranged for being in electrical contact with at least one of the plurality of electrically conductive threads, thereby forming at least one electrical connection between the at least one rigid electronic or optoelectronic component and the at least one electrically conductive thread of the flexible and/or stretchable textile layer (10), The smart textile product is provided with an elastomeric encapsulation layer in which the electrical connection is embedded, so as to provide a gradual transition in deformability between the flexible and/or stretchable textile fabric and the at least one rigid component at the location of the at least one electrical connection.

It has been found that by providing an elastomeric encapsulation layer, the mechanical stress at the location of the at least one electrical connection is reduced, thereby improving the reliability of the smart textile structure. The elastomeric encapsulation layer may be arranged for forming at the location of the at least one electrical contact a gradual mechanical stress transition area, which offers a gradual transition between the deformability of the rigid electronic or optoelectronic component and the flexible and/or stretchable textile fabric. As a result, with the provision of an elastomeric encapsulation, the mechanical stress applied locally at the location of the at least one electrical connection e.g. due to the stretching of the textile fabric, can be greatly reduced compared to solutions of the prior art, thereby significantly improving the reliability of the smart textile product. For example, the elastomeric encapsulation layer may act as a mechanical stress buffer zone, which is arranged for absorbing a large proportion of the mechanical stress applied, thereby reducing the local stress applied locally to the electrical connection. As a result, by reducing the mechanical stress applied locally at the location of the electrical connection, the reliability of the smart textile product may be significantly improved.

According to embodiments of the present disclosure the at least one rigid electronic or optoelectronic component may be at least partly embedded in the elastomeric encapsulation layer.

It has been found that by embedding at least partially the rigid electronic or optoelectronic component in the elastomeric encapsulation layer, the mechanical stress applied at the location of the at least one electrical contact may be further reduced, thereby further improving the reliability of the smart textile product.

According to embodiments of the present disclosure, the elastomeric encapsulation layer is arranged for being deformed in any direction. The elastomeric encapsulation layer may be made from a material having a predetermined deformability in response to an applied mechanical stress. For example, the elastomeric encapsulation layer may be a silicon based material, such as PDMS (Polydimethylsiloxane) or another deformable material known in the art.

It has been found that by providing a deformable elastomeric encapsulation layer, in particular an elastomeric encapsulation layer having a predetermined deformability in response to an applied mechanical stress, e.g. by stretching the textile fabric, it is possible to further enhance the reliability of the electrical connection(s). This is because a large proportion of the mechanical stress applied can be absorbed by the deformation of the elastomeric encapsulation layer. As a result, an enhanced mechanical stress transition area is formed at the location of the at least one electrical connection, with a gradual and predetermined transition between components having different deformability properties, e.g the material with predetermined deformability as a transition between the rigid electronic or optoelectronic component and the flexible and/or stretchable textile fabric.

According to embodiments of the present disclosure, the at least one contact pad is arranged for being connected to the at least one electrically conductive thread by means of an electrically conductive material. For example, the electrically conductive material may be an adhesive material or a solder material. The electrically conductive material may be selected to have a predetermined response to mechanical stress applied at the location of the at least one electrical contact.

According to embodiments of the present disclosure, the electrically conductive threads are separated by a gap. For example, the electrically conductive threads may be substantially parallel to one another. It has been found that by providing a gap between the electrically conductive threads, the risk of a short circuit between the electrically conductive threads is reduced. The gap may be dimensioned according to the area taken by the at least one electrical contact.

In embodiments of the present disclosure the at least one rigid component may be a small component, e.g. having a size in the range between 0.5 mm×0.5 mm and 2 mm×4 mm or having a diameter smaller than 5 mm. However, the present disclosure is not limited thereto and larger components may be used.

In embodiments of the present disclosure, the at least one rigid component may be a packaged component or a non-packaged component (i.e. a bare die). In embodiments of the present disclosure the at least one component may be encapsulated, for example within a rigid epoxy material, before its attachment to the textile fabric.

In embodiments of the present disclosure the at least one rigid component may for example be a LED, a sensor, a resistor, a capacitor, a memory cell, a processing unit or a transistor, the present disclosure not being limited thereto.

According to a second aspect, the present disclosure relates to a method for fabricating a smart textile product according to embodiments of the first aspect of the present disclosure, the method comprising the steps of:
  providing a flexible and/or stretchable textile fabric comprising a plurality of electrically conductive threads;
  providing a rigid electronic or optoelectronic component comprising at least one electrically conductive pad or contact pad; and
  forming an electrical connection between the at least one electrical conductive pad and at least one of the plurality of electrical conductive threads of the flexible and/or stretchable textile fabric; and
  forming an elastomeric encapsulation layer at the location of the at least one electrical connection, in which encapsulation layer the electrical connection is embedded, so as to provide a gradual transition in deformability between the flexible and/or stretchable textile fabric and the at least one rigid component at the location of the at least one electrical connection.

In embodiments of the present disclosure the at least one electronic or optoelectronic component may have more than one contact pad electrically connected to an electrically conductive thread of the textile fabric. In such embodiments the liquid precursor preferably surrounds each electrical connection and an elastomeric encapsulation layer embedding each electrical connection is preferably formed.

According to embodiments of the present disclosure the step of forming the elastomeric encapsulation layer comprises the steps of:
  providing a liquid precursor of an elastomeric material on the flexible and/or stretchable textile fabric;
  waiting for a predetermined period of time so as to allow the liquid precursor to penetrate into the textile fabric and to surround the electrical connection; and
  curing the liquid precursor, thereby forming the elastomeric encapsulation layer.

It has been found that by forming the elastomeric encapsulation layer according to the above steps, it allows for the textile layer to be impregnated with the liquid precursor, thereby forming at the location of the electrical connection, after the curing step, a mechanical stress transitional area, which is arranged for absorbing a large proportion of the mechanical stress applied to the electrical contact, e.g. when stretching the textile layer. For example, the elastomeric encapsulation layer may act as a mechanical stress buffer zone, which is arranged for absorbing a large proportion of the mechanical stress applied, thereby reducing the local stress applied locally to the electrical connection. As a result, by reducing the mechanical stress applied locally at the location of the electrical connection, the reliability of the smart textile product may be significantly improved.

According to embodiments of the present disclosure, providing the liquid precursor of the elastomeric material may comprise providing the liquid precursor near, e.g. adjacent to, at least one lateral edge, e.g. adjacent to all lateral edges, of the at least one electronic or optoelectronic component. The liquid precursor is provided such that, upon penetration into the textile fabric, it can surround the electrical connection, e.g. each electrical connection, such that it is no longer exposed to the environment.

According to embodiments of the present disclosure, providing the liquid precursor may further comprise providing the liquid precursor in an area covering at least part of the at least one electronic or optoelectronic component, e.g. fully covering the at least one electronic or optoelectronic component.

According to embodiments of the present disclosure providing the liquid precursor of the elastomeric material may comprise providing the precursor by dispensing.

According to embodiments of the present disclosure providing the liquid precursor of the elastomeric material may comprise: positioning a mold on the textile fabric, the mold covering the at least one electronic or optoelectronic component and its electrical connections; and filling the mold with the liquid precursor.

It has been found that by using a mold the liquid precursor may be more accurately provided on the desired area of the textile fabric.

According to embodiments of the present disclosure the viscosity of the liquid precursor is preferably selected to be sufficiently low, such as for example in the range between 1 Pa·s and 70 Pa·s, e.g. in the range between 1 Pa·s and 10 Pa·s, to allow easy penetration of the precursor into the textile fabric. This selection may for example depend on the absorption rate of the textile fabric and on the type of textile fabric, e.g. on the yarn distance of the textile fabric. Suitable combinations of textile fabrics and liquid precursors may be found experimentally.

According to embodiments of the present disclosure, allowing the liquid precursor to penetrate into the textile fabric and to surround the electrical connection may comprise waiting for a period of time, wherein the waiting time depends for example on the viscosity of the liquid precursor, the absorption rate of the textile fabric and the environmental temperature. The waiting time may for example be in the range between 1 minute and 2 hours, the present disclosure not being limited thereto. A suitable waiting time for a given combination of textile fabric, liquid precursor and environmental temperature may be found experimentally.

According to embodiments of the present disclosure the liquid precursor is provided in a mold, allowing the liquid precursor to penetrate into the textile fabric may further comprise changing a pressure in the mold, thereby influencing the penetration rate of the liquid precursor into the textile fabric.

According to embodiments of the present disclosure, the step of curing may for example comprise exposing the liquid precursor to UV light. Alternatively, curing the liquid precursor may for example comprise thermal curing. Thermal curing may for example be done at a temperature between ambient temperature (e.g. 18° C. to 25°) and 100° C., preferably between ambient temperature and 50° C.

According to embodiments of the present disclosure, a plurality of components may be attached to (integrated with) the textile fabric. For example, an array of components such as for example an array of LEDs or an array of sensor elements may be integrated with the textile fabric, the present disclosure not being limited thereto.

According to embodiments of the present disclosure, the step of forming an electrical connection between a contact pad and an electrically conductive thread may for example comprise the step of soldering, crimping, or providing a conductive adhesive material between the contact pad and the electrically conductive thread.

According to embodiments of the present disclosure, the step of forming an electrical connection between a contact pad and an electrically conductive thread may further comprise the step of providing an interposer between the at least one electronic or optoelectronic component and the textile fabric.

It is an advantage of a method and device of the present disclosure that the mechanical and electrical failure rate of the electrical connections is reduced as compared to known approaches.

It is an advantage of a method and device of the present disclosure that a reduced sensitivity to moisture and/or chemicals may be obtained as compared to known approaches.

Certain objects and advantages of various inventive aspects have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

BRIEF DESCRIPTION OF THE FIGURES

FIG. 1(a) to FIG. 1(c) schematically show process steps of a method in accordance with an embodiment of the present disclosure, resulting in a first smart textile product according to the present disclosure.

FIG. 2(a) to FIG. 2(d) schematically show process steps of a method in accordance with an embodiment of the present disclosure.

Figure 3:
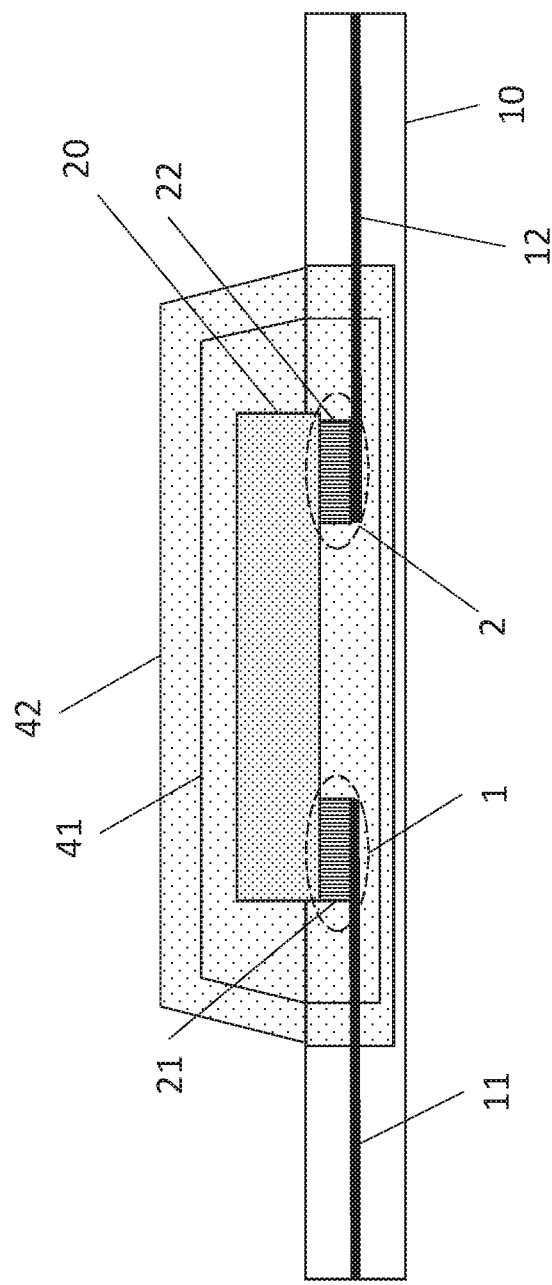
FIG. 3 shows an alternative embodiment of a second smart textile product according to the present disclosure.

Any reference signs in the claims shall not be construed as limiting the scope of the present disclosure.

In the different drawings, the same reference signs refer to the same or analogous elements.

DETAILED DESCRIPTION

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In the context of the present disclosure, flexible means non-stiff, non-rigid, i.e. able to bend without breaking, but not stretchable. A flexible structure is adapted to be deformable in a certain direction during normal use of the structure, but does not elongate. The length does not change during bending.

In the context of the present disclosure, stretchable means resilient, i.e. elastically deformable with elongation. A stretchable structure is adapted to be elastically deformable (with elongation) during normal use, under an applied force and to return substantially to its original shape, substantially without permanent deformation, when the applied force is relaxed.

In the context of the present disclosure, rigid means stiff, i.e. not able to bend or highly resistant to bending.

In the context of the present disclosure, an elastomer or an elastomeric material is a visco-elastic polymer material with a low Young's modulus (10 MPa or lower) that can be deformed in any direction and wherein the deformation can occur multiple times (e.g. more than 100 times for a 400% elongation) before breakage.

The present disclosure provides a method for fabricating smart textile products, comprising the integration of electronic and/or optoelectronic components with a textile fabric, wherein the reliability under mechanical stress is improved as compared to known methods, resulting in reduced mechanical and electrical failure rates. In a method of the present disclosure, at least one component, e.g. rigid component, is attached to a textile fabric and contact pads of the at least one component are electrically connected to electrically conductive threads integrated with the textile fabric using known methods. Afterwards an elastomeric encapsulation layer is formed, the encapsulation layer embedding at least the electrical connections between the contact pads and the electrically conductive threads.

Forming the elastomeric encapsulation layer comprises: providing a liquid precursor of an elastomeric material, allowing the liquid precursor to penetrate into the textile fabric and to surround the electrical connections, and curing the liquid precursor, thereby forming the elastomeric encapsulation layer.

It was found that a method of the present disclosure results in an improved reliability under mechanical stress as compared to prior art methods. An improved reliability of the electrical connections was obtained, as well as an improved reliability of the mechanical attachment of the at least one component to the textile fabric. This may be related to the elastomer providing a gradual transition in deformability between the flexible, bendable textile fabric material at one hand and the rigid component and the electrical connections at the other hand.

Process steps of a method according to an embodiment of the present disclosure are schematically illustrated in FIG. 1.

FIG. 1(a) shows an electronic or optoelectronic rigid component 20 mechanically attached to a textile fabric 10, with a first contact pad 21 of the component 20 electrically connected to a first electrically conductive thread 11 of the textile fabric and with a second contact pad 22 of the component 20 electrically connected to a second electrically conductive thread 12 of the textile fabric. The contact pads 21, 22 may for example be electrically connected to the conductive threads 11, 12 by means of an electrically conductive material (not shown in FIG. 1(a)) such as an adhesive material or a solder material.

In the embodiment shown in FIG. 1(a), the structure has a first electrical connection 1 consisting of the first contact pad 21, the part of the first conductive thread 11 in contact with the first contact pad 21 and optionally an electrically conductive material such as an adhesive material or a solder material in between (not shown). The structure has a second electrical connection 2 consisting of the second contact pad 22, the part of the second conductive thread 12 in contact with the second contact pad 22 and optionally an electrically conductive material such as an adhesive material or a solder material in between (not shown). The structure shown in FIG. 1(a) may be fabricated using known methods.

In the example shown in FIG. 1(a) the second conductive thread 12 is shown as an extension of the first conductive thread 11, with a gap or interruption in between. However, other configurations may be used. For example the first conductive thread 11 and the second conductive thread 12 may be substantially parallel threads.

Next, as shown in FIG. 1(b), a liquid precursor 30 of an elastomeric material is (locally) provided on the textile layer 10, e.g. by dispensing. In the example shown in FIG. 1(b), the liquid precursor 30 is provided adjacent to the lateral edges of the component 20, and in an area covering the component 20, i.e. covering the surface of the component facing away from the textile layer 10.

The liquid precursor 30 may for example be a precursor for a silicon elastomer. For example, it may be a PDMS (PolyDiMethylSiloxane) precursor, the present disclosure not being limited thereto.

Upon providing the liquid precursor 30, it penetrates into the textile fabric 10. In a method of the present disclosure, the liquid precursor 30 penetrates into the textile fabric 10 till at least the electrical connections 1, 2 are surrounded by the liquid precursor 30. This is illustrated in FIG. 1(c). In this context, surrounded by the liquid precursor means enclosed by the liquid precursor. For example, the electrical connections 1, 2 being surrounded or enclosed by the liquid precursor 30 means that the electrical connections 1, 2, including the contact pads 21, 22, the part of the electrically conductive yarns 11, 12 in contact with the contact pads 21, 22 and the contact points or contact regions between the contact pads 21, 22 and the electrically conductive yarns 11, 12 are no longer exposed to the environment (e.g. through the textile layer). This is a result of the penetration of the liquid precursor into the textile fabric 10.

After having provided the liquid precursor 30 of the elastomeric material and after sufficient penetration of the liquid precursor into the textile fabric 10, the precursor is cured such that it solidifies into a solid elastomer, thereby forming an elastomeric encapsulation layer 31 (FIG. 1(c)). Curing of the liquid precursor may for example be done by UV exposure or by heating, the present disclosure not being limited thereto. When curing is done by heating, preferably a curing temperature not higher than 100° C. is used, preferably a curing temperature between ambient temperature and 50° C.

In the example shown in FIG. 1(c), the side of the component 20 not in contact with the textile layer is fully covered by the elastomer 31, and due to the penetration of the liquid elastomer 30 in the textile layer 10 the electrical contact regions or electrical connections 1, 2 are embedded in the elastomer 31. Only a part of the component 20 in contact with the textile fabric 10 is not encapsulated, i.e. not covered by the elastomer 31. However, in embodiments of the present disclosure also the rigid component 20 can be fully encapsulated by or fully embedded in the elastomer 31.

Process steps of a method according to another embodiment of the present disclosure are schematically illustrated in FIG. 2. FIG. 2(a) shows an electronic or optoelectronic rigid component 20 mechanically attached to a textile fabric 10, with a first contact pad 21 of the component 20 being electrically connected to a first electrically conductive thread 11 of the textile fabric 10 and a second contact pad 22 of the component 20 being electrically connected to a second electrically conductive thread 12 of the textile fabric 10, The contact pads 21, 22 may for example be electrically connected to the conductive threads 11, 12 by means of an electrically conductive material (not shown in FIG. 2(a)) such as an adhesive material or a solder material.

The structure shown in FIG. 2(a) has a first electrical connection 1 consisting of the first contact pad 21, the part of the first conductive thread 11 in contact with the first contact pad 21 and optionally an electrically conductive material in between (not shown). The structure has a second electrical connection 2 consisting of the second contact pad 22, the part of the second conductive thread 12 in contact with the second contact pad 22 and optionally an electrically conductive material in between (not shown). The structure shown in FIG. 2(a) may be fabricated using known methods.

Next, as shown in FIG. 2(b), a mold 40 is provided over the rigid component 20, the mold 40 extending beyond the lateral edges of the component 40. Providing the mold 40 may for example comprise providing an iron plate at a side of the textile layer 10 opposite to the side where the component 20 is located, attaching magnets to the mold 40, and fixing the mold with the magnets to the iron plate, with the textile layer 10 and the rigid component 20 in between the mold and the iron plate.

Afterwards (FIG. 2(c)) a liquid precursor 30 of an elastomeric material is injected into the mold 40, allowed to penetrate into the textile fabric 10 till at least the electrical connections 1, 2 are surrounded by the liquid precursor 30, and cured to obtain a solid elastomer, thereby forming an elastomeric encapsulation layer 31. After release of the mold a structure as shown in FIG. 2(d) is obtained. In the example shown, the rigid component 20 and the electrical connections 1, 2 are fully encapsulated in the elastomeric encapsulation layer 31.

In embodiments of the present disclosure the textile fabric 10 may be a woven fabric or a non-woven fabric. In embodiments of the present disclosure wherein the textile fabric is a woven fabric, electrically conductive threads may be woven in the textile fabric. In other embodiments the electrically conductive threads may be conductive lines provided on a surface of the textile layer. Such conductive lines may for example be formed by printing an electrically conductive ink on a woven fabric or on a non-woven fabric. Alternatively, such conductive lines may be formed by stitching electrically conductive threads on the textile layer.

Forming an electrical connection between a contact pad and an electrically conductive thread may for example comprise: attaching the component to the fabric or textile layer by means of an electrically non-conductive adhesive material; and providing an electrically conductive material (e.g. an electrically conductive adhesive) at the location of the contact pads, the electrically conductive material being provided such that it forms an electrical connection between the contact pad and the corresponding electrically conductive thread. In some embodiments, the non-conductive adhesive material and other electrically insulating materials that may be present between the contact pads and the electrically conductive threads (such as for example an insulating coating of the electrically conductive threads) may be removed at the location of the contact pads after attaching the component to the textile layer and before providing the electrically conductive adhesive material.

Other suitable methods may be used for forming an electrical connection between a contact pad and an electrically conductive thread, such as for example soldering or crimping. Generally, the electrical connection(s) may be formed before, during or after the attachment of the component to the textile layer.

In embodiments of the present disclosure, the selection of a suitable precursor for the elastomeric material and the process conditions for curing the precursor depend on the type of textile and on the properties of the textile fabric to which the components are attached. For example, the absorption rate of the textile layer has an impact on the selection of a suitable precursor. The absorption rate is the amount of water a textile fabric can absorb in a given amount of time. The absorption rate of a textile layer depends for example on the yarn type and on the method of textile production e.g. woven versus knitted fabrics. It depends also on the distance between neighboring yarns (which a.o. depends on the method of textile production). Both the absorption rate and the yarn distance influence the required viscosity of the liquid precursor and/or the waiting time needed to allow sufficient penetration of the liquid precursor into the textile fabric (i.e. to surround the electrical connections) and/or the curing time and curing temperature needed to enable a proper encapsulation.

The viscosity of the precursor of the elastomer material influences, for a given textile fabric, the penetration depth of the precursor into the textile fabric and thus how good the precursor and consequently the elastomeric encapsulation layer surrounds the electrical connections and the electronic or optoelectronic component. Therefore, the primary criterion for selecting a precursor is its viscosity. This selection may depend on the characteristics (e.g. absorption rate, yarn distance) of the textile fabric used.

For example, a textile fabric comprising satin cotton of 144 $g/m^2$ may be used in combination with a Sylgard 186 precursor (viscosity 70 Pa·s), that may be dispensed at ambient temperature. After providing the liquid precursor on the textile fabric it is allowed to penetrate into the textile fabric at ambient temperature for a predetermined period of time (e.g. 2 hours at 23° C.) until it fully surrounds the electrical connections. Next it may be cured e.g. for 4 hours at 50° C. to form the elastomeric encapsulation layer.

Depending on the specific application, it may be preferred to have a fully encapsulated component. For such applications, a liquid precursor with a lower viscosity is needed, for example a liquid precursor having a viscosity in the range between 1 Pa·s and 10 Pa·s.

Selecting a proper elastomer precursor for a given textile fabric may also be influenced by the curing time and curing temperature needed. For example, cotton fabrics can withstand higher temperatures as compared to polyester fabrics, and thus an elastomer with a higher curing temperature may be used in combination with a cotton fabric than in combination with a polyester fabric.

In embodiments of the present disclosure the elastomeric encapsulation material may be selected to provide protection against chemical substances, humidity or moisture, for example for washable products.

In embodiments of the present disclosure, an example of which is shown in FIG. 3, two or more layers of elastomeric encapsulation material may be provided, for example a first layer 41 in a predetermined first elastomer selected for optimizing the reduction of mechanical stress at the location of the electrical connections 1, 2 and a second layer 42 in a predetermined second elastomer to provide protection against chemical substances, humidity or moisture, for example for washable products. The material of the two or more layers can also be selected to obtain other effects, such as for example a gradually increasing deformability between the rigid component 20 and the fabric 10. The two or more layers of elastomeric encapsulation material may for example be applied using a process as described with reference to FIG. 2(a) to FIG. 2(d), with each time a larger mold for the subsequent layer.

In embodiments of the present disclosure the elastomeric encapsulation material may be selected to be transparent in a predetermined wavelength range. This allows integrating light sources such as LEDs and/or light absorbing devices with a textile fabric, in a robust but flexible and non-disturbing way.

In embodiments of the present disclosure, a further criterion for selecting an elastomeric material may be its thermal conductivity, for example for applications wherein the integrated components are power devices. This may also determine the maximum thickness of the encapsulation layer.

Washing tests were done for three different smart textile samples. For each sample, 10 rigid components (size 1.6 mm×0.8 mm, thickness 0.4 mm, standard 0603 package) were attached to a non-woven textile layer with their contact pads electrically connected to electrically conductive threads that were stitched on the textile layer. The electrical connections between the contact pads and the electrically conductive threads were established by means of an electrically conductive adhesive.

For the first sample, the rigid components were integrated with the textile fabric without any protective layer over the components or their electrical connections. In the second sample a rigid epoxy layer was provided over the components. The third sample was fabricated according to a method of the present disclosure, wherein the electrical connections were embedded in a silicone encapsulation layer and wherein the silicone encapsulation layer also covered the surface of the components facing away from the textile layer (as e.g. shown in FIG. 1(c)).

The washing tests were done according to the ISO 6330: 2000 norm "Textiles—Domestic washing and drying procedures for textile testing". Table 1 shows the number of failed components as a function of the number of washing cycles for the different samples.

TABLE 1

| # cycles | sample 1 no protection | sample 2 epoxy | sample 3 silicone |
|---|---|---|---|
| 5 | 1 | 0 | 0 |
| 10 | 4 | 2 | 0 |

TABLE 1-continued

| # cycles | sample 1 no protection | sample 2 epoxy | sample 3 silicone |
|---|---|---|---|
| 20 | 10 | 10 | 1 |
| 25 | 10 | 10 | 1 |

For the sample without any protective layer (sample 1) the main failure mechanism was the complete delamination of the component. For the sample with a rigid epoxy protection (sample 2) the failures were mainly related to breakage of textile threads, resulting in electrical failure. For sample 1 one of the components failed after 5 washing cycles and for sample 2 two components failed after 10 washing cycles. For both samples all components failed after 20 washing cycles.

For the sample that was fabricated according to a method of the present disclosure (sample 3) no components failed after 10 washing cycles, and only a single component failed after 20 and 25 washing cycles. This failure was due to delamination of the component. These results illustrate a significant improvement of the reliability under mechanical stress (washing tests) of a smart textile product fabricated according to a method of the present disclosure, as compared to samples fabricated according to prior art methods.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the invention.

The invention claimed is:

1. A smart textile product comprising: a flexible and/or stretchable textile fabric comprising a plurality of electrically conductive threads; at least one rigid electronic or optoelectronic component comprising at least one electrically conductive pad, the at least one electrically conductive pad being configured to be in electrical contact with at least one of the plurality of electrically conductive threads to provide at least one electrical connection between the at least one rigid electronic or optoelectronic component and the at least one of the electrically conductive threads of the flexible and/or stretchable textile fabric; and at least one elastomeric encapsulation layer, wherein the at least one electrical connection is embedded in the at least one elastomeric encapsulation layer to provide a gradual transition in deformability between the flexible and/or stretchable textile fabric and the at least one rigid component at a location of the at least one electrical connection, wherein the at least one elastomeric encapsulation layer comprises a first elastomeric encapsulation layer comprising a first elastomer and a second elastomeric encapsulation layer comprising a second elastomer different from the first elastomer.

2. The smart textile product according to claim 1, wherein the at least one rigid electronic or optoelectronic component is at least partly embedded in the at least one encapsulation layer.

3. The smart textile product according to claim 1, wherein the at least one electrically conductive pad is configured to be connected to the at least one electrically conductive thread by an electrically conductive material.

4. The smart textile product according to claim 3, wherein the electrically conductive material is an adhesive material.

5. The smart textile product according to claim 3, wherein the electrically conductive material is a solder material.

6. The smart textile product according to claim 1, wherein the plurality of electrically conductive threads are separated by a gap.

7. The smart textile product according to claim 1, wherein the plurality of electrically conductive threads are substantially parallel to one another.

8. The smart textile product according to claim 1, wherein the elastomeric encapsulation layer is a silicon based material or a polydimethylsiloxane.

9. The smart textile product according to claim 1, wherein the first elastomer is selected for optimizing a reduction of mechanical stress at the location of the at least one electrical connection and wherein the second elastomer is selected to provide protection against chemical substances, humidity or moisture.

10. The smart textile product according to claim 1, wherein the first elastomer and the second elastomer are selected to provide a gradually increasing deformability between the rigid component and the fabric.

11. A method for fabricating a smart textile product according to claim 1, comprising: providing a flexible and/or stretchable textile fabric comprising a plurality of electrically conductive threads; forming at least one electrical connection between the rigid electronic or optoelectronic component and at least one of the plurality of electrical conductive threads; and forming at least one elastomeric encapsulation layer at a location of the at least one electrical connection, wherein the at least one electrical connection is embedded in the at least one encapsulation layer to provide a gradual transition in deformability between the flexible and/or stretchable textile fabric and the at least one rigid electronic or optoelectronic component at the location of the at least one electrical connection.

12. The method according to claim 11, wherein the forming the at least one elastomeric encapsulation layer comprises: providing a liquid precursor of an elastomeric material on the flexible and/or stretchable textile fabric; waiting for a predetermined period of time to allow the liquid precursor to penetrate into the flexible and/or stretchable textile fabric and to surround the at least one electrical connection; and curing the liquid precursor, thereby forming an elastomeric encapsulation layer.

13. The method according to claim 12, wherein the liquid precursor is provided adjacent to at least one lateral edge of the rigid electronic or optoelectronic component.

14. The method according to claim 12, wherein the providing the liquid precursor comprises covering at least partially the rigid electronic or optoelectronic component.

15. The method according to claim 12, wherein the providing the liquid precursor comprises dispensing the liquid precursor.

16. The method according to claim 12, wherein the providing the liquid precursor comprises: positioning a mold on the flexible and/or stretchable textile fabric; and filling the mold with the liquid precursor.

17. The method according to claim 16, wherein the mold is positioned on the flexible and/or stretchable textile fabric such that it covers the electronic or optoelectronic component and the at least one electrical connection.

18. The method according to claim 12, wherein the predetermined period of time is selected based on a viscosity of the liquid precursor and an absorption rate of the flexible and/or stretchable textile fabric.

19. The method according to claim 12, wherein the forming at least one elastomeric encapsulation layer comprises forming a first elastomeric encapsulation layer comprising a first elastomer and forming a second elastomeric encapsulation layer comprising a second elastomer, wherein the first layer and the second layer are formed by: providing a first liquid precursor of a first elastomeric material on the flexible and/or stretchable textile fabric; waiting for a predetermined period of time to allow the first liquid precursor to penetrate into the flexible and/or stretchable textile fabric and to surround the at least one electrical connection; curing the liquid precursor, thereby forming the first elastomeric encapsulation layer; providing a second liquid precursor of a second elastomeric material on the flexible and/or stretchable textile fabric; waiting for a predetermined period of time to allow the second liquid precursor to penetrate into the flexible and/or stretchable textile fabric and to surround the first elastomeric encapsulation layer; and curing the second liquid precursor, thereby forming the second elastomeric encapsulation layer.

* * * * *